(12) United States Patent
Hetzmannseder et al.

(10) Patent No.: US 12,313,656 B2
(45) Date of Patent: May 27, 2025

(54) SNAP-ON CURRENT SENSOR DESIGN

(71) Applicant: Suzhou Littelfuse OVS Co., Ltd., Suzhou (CN)

(72) Inventors: Engelbert Hetzmannseder, Klosterneuburg (AT); Jianfei Zhao, Suzhou (CN); Linas Sarkauskas, Vilnius (LT)

(73) Assignee: Suzhou Littelfuse OVS Co., Ltd., Suzhou (CN)

( * ) Notice: Subject to any disclaimer, the term of this patent is extended or adjusted under 35 U.S.C. 154(b) by 0 days.

(21) Appl. No.: 17/816,027

(22) Filed: Jul. 29, 2022

(65) Prior Publication Data
US 2023/0042505 A1   Feb. 9, 2023

(30) Foreign Application Priority Data

Aug. 6, 2021   (CN) .......................... 202110900035.0

(51) Int. Cl.
*G01R 15/20* (2006.01)
*G01R 19/00* (2006.01)

(52) U.S. Cl.
CPC ......... *G01R 15/20* (2013.01); *G01R 19/0092* (2013.01)

(58) Field of Classification Search
CPC ............................ G01R 15/20; G01R 19/0092
See application file for complete search history.

(56) References Cited

U.S. PATENT DOCUMENTS

| 2010/0066475 | A1* | 3/2010 | Goldblatt | G01R 1/22 336/92 |
| 2010/0237853 | A1 | 9/2010 | Bose | |
| 2013/0257469 | A1 | 10/2013 | Arima | |
| 2014/0312893 | A1* | 10/2014 | Burkart | G01R 15/207 324/251 |
| 2015/0309080 | A1 | 10/2015 | Chae | |
| 2016/0169941 | A1* | 6/2016 | Fukui | G01R 15/207 324/117 R |

FOREIGN PATENT DOCUMENTS

| CN | 108663559 A | * | 10/2018 | ............... G01R 1/04 |
| EP | 3106884 A1 | | 12/2016 | |
| KR | 200471248 Y1 | * | 2/2004 | |

OTHER PUBLICATIONS

European Search Report and Written Opinion for the European Patent Application No. EP22185310, mailed Jan. 3, 2023, 7 pages.

* cited by examiner

*Primary Examiner* — Feba Pothen
(74) *Attorney, Agent, or Firm* — KDW Firm PLLC

(57) ABSTRACT

A snap-on assembly includes a housing that holds an integrated circuit with a sensor. A connector supplies power to the integrated circuit and transmits a signal from the integrated circuit to an electronic circuit. An insert fits into an opening of the housing and secures a conductor in the housing without a mechanical fastener. The sensor measures a magnetic field resulting from a current traveling through the conductor.

13 Claims, 8 Drawing Sheets

SNAP-ON CURRENT SENSOR DESIGN

CROSS REFERENCE TO RELATED APPLICATION

This application claims the benefit of priority to Chinese Patent Application No. 202110900035.0 filed Aug. 6, 2022, entitled "A SNAP-ON CURRENT SENSOR DESIGN," which application is incorporated herein by reference in its entirety.

FIELD OF THE DISCLOSURE

Embodiments of the present disclosure relate to current sensors and, more particularly, to magnetic field-based current sensors.

BACKGROUND

Current sensing is any one of several techniques used to measure electric current. Current sensors can measure current passively without interrupting the circuit by using the magnetic field to detect the current and generate an output that is proportional to the current.

The current sensors are placed around the conductor of current, such as a cable or busbar, to perform the measurement. The current sensors are kept in place using a mechanical fastener, such as a screw with a nut to fix the sensor onto the busbar or cable. If one or more portions of the mechanical fastener becomes loose or lost, the current sensor becomes loose on the conductor, resulting in unreliable results or even loss of function.

It is with respect to these and other considerations that the present improvements may be useful.

SUMMARY

This Summary is provided to introduce a selection of concepts in a simplified form that are further described below in the Detailed Description. This Summary is not intended to identify key or essential features of the claimed subject matter, nor is it intended as an aid in determining the scope of the claimed subject matter.

An exemplary embodiment of a snap-on assembly in accordance with the present disclosure may include a housing that holds an integrated circuit (IC) with a sensor. A connector supplies power to the IC and transmits a signal from the IC to an electronic circuit. An insert fits into an opening of the housing and secures a conductor in the housing without a mechanical fastener. The sensor measures a magnetic field resulting from a current traveling through the conductor.

Another exemplary embodiment of a snap-on assembly in accordance with the present disclosure may include a housing, an insert to fit into an opening of the housing, and two wire ties. The housing includes an IC with a sensor that measures a magnetic field resulting from a current traveling through a conductor. The insert secures the conductor in the housing without a mechanical fastener and includes a first extension to be placed on a first side of the housing and a second extension to be placed on a second, opposing side of the housing, the second side being opposite and parallel to the first side. The two extensions each include grooves. The first wire tie is to be looped around the first extension at the first groove and tightened. The second wire tie is to be looped around the second extension at the second groove and tightened. The conductor is inserted through the first extensions, through the insert, and through the second extension. The first and second wire ties secure the conductor in the housing.

DETAILED DESCRIPTION

A snap-on assembly, for sensing current on a conductor, is disclosed for fitting onto a cable or busbar. The snap-on assembly is affixed to the cable or busbar without need of a mechanical fastener. A single housing is used for either the cable or the busbar. The housing of the snap-on assembly is used with one (busbar) or two (cable) plastic inserts which may be customized for different cable or busbar designs. The plastic inserts include features to prevent movement of the cable or busbar once the snap-on assembly is in place. The housing of the snap-on assembly optionally includes extensions to hold wire ties for additional security against movement.

For the sake of convenience and clarity, terms such as "top", "bottom", "upper", "lower", "vertical", "horizontal", "lateral", "transverse", "radial", "inner", "outer", "left", and "right" may be used herein to describe the relative placement and orientation of the features and components of the electrical box, each with respect to the geometry and orientation of other features and components of the electrical box appearing in the perspective, exploded perspective, and cross-sectional views provided herein. Said terminology is not intended to be limiting and includes the words specifically mentioned, derivatives therein, and words of similar import.

Figure 1A:
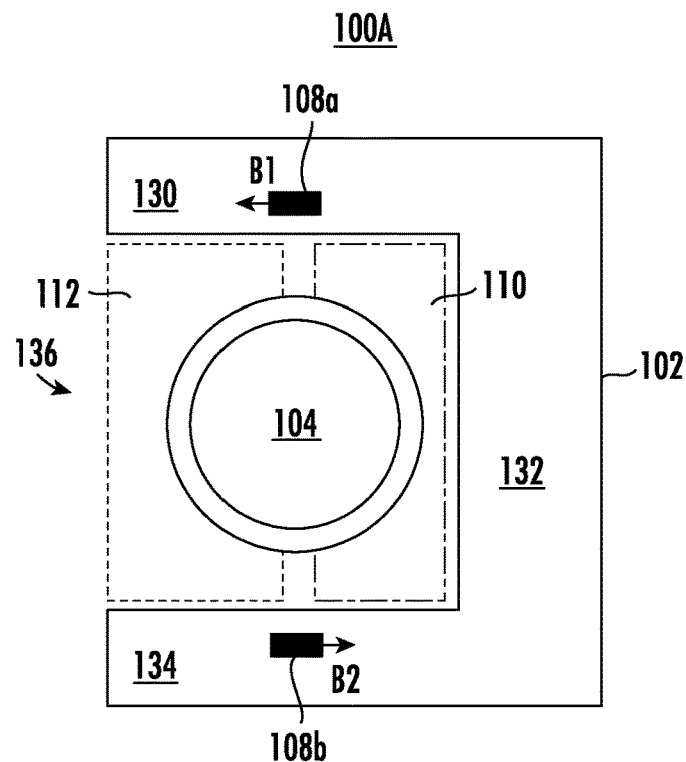
FIGS. 1A-B are diagrams illustrating a snap-on assembly, in accordance with exemplary embodiments.
Figure 1B:
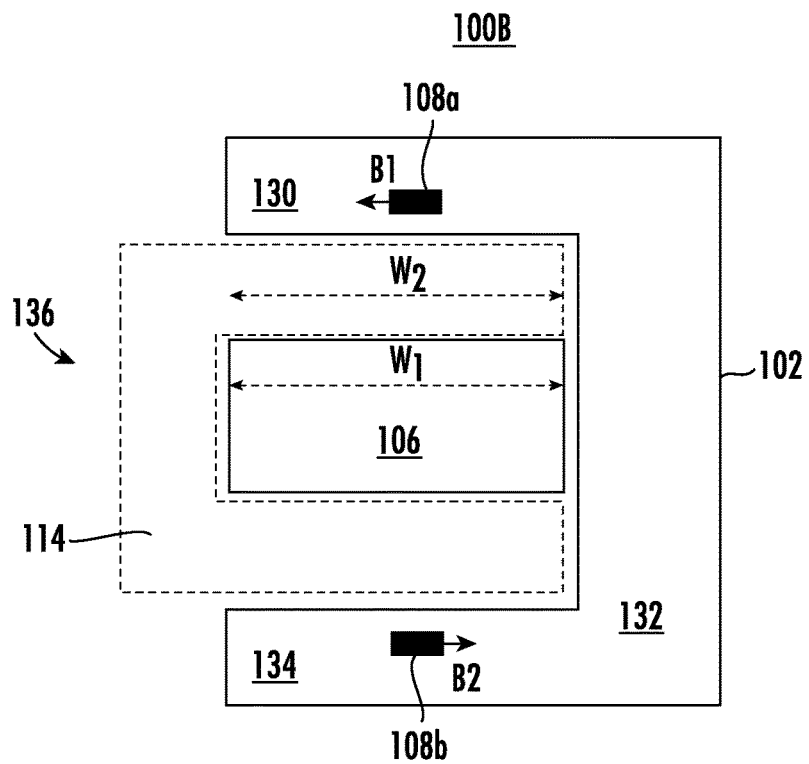

FIGS. 1A and 1B are representative drawings of a snap-on assembly for sensing current across a conductor, such as a cable or busbar, according to exemplary embodiments. FIG. 1A is an overhead view of snap-on assembly 100A for affixation on a cable; FIG. 1B is an overhead view of snap-on assembly 100B for affixation on a busbar (collectively, "snap-on assembly 100"). The snap-on assembly 100 features a housing 102 with a first side 130, a second side 132, and a third side 134, with first side 130 being connected at one end to second side 132, first side 130 being perpendicular to second side 132, second side 132 being connected at an opposing end to third side 134, third side 134 being perpendicular to second side 132 at the opposing end, such that first side 130 and third side 134 are parallel to one another. From the overhead view, the first side 130, second side 132, and third side 134 look like a backwards letter "C" or a sideways letter "U".

The snap-on assembly 100A of FIG. 1A measures the current across a cable 104. An inner insert 110 is placed in an opening 136 of the housing 102, followed by the cable 104, and an outer insert 112 is then placed in the housing. In exemplary embodiments, the inner insert 110 and the outer insert 112 surround the cable 104, holding the cable in place inside the opening 136 of the housing 102. In exemplary embodiments, the inner insert 110 and the outer insert 112 are made of a non-conductive material, such as plastic. The disclosed embodiments are not limiting in this regard.

The snap-on assembly 100B of FIG. 1B measures the current across a busbar 106. In contrast to the two-insert embodiment of FIG. 1A, one insert 114 is placed in the opening 136 to hold the busbar 106 in place. In exemplary embodiments, the insert 114 is shaped to surround the busbar 106, holding the busbar in place inside the opening 136 of the housing 102. In exemplary embodiments, the insert 114 is made of a non-conductive material, such as plastic. The disclosed embodiments are not limiting in this regard.

The housing 102 of snap-on assembly 100A is not different from the housing of snap-on assembly 100B. Put another way, the housing 102 is interchangeable, whether the application is to perform current sensing of the cable 104 or of the busbar 106. By simply removing the inner insert 110 and the outer insert 112 and replacing them with insert 114, the application of the snap-on assembly 100 can change from the cable 104 to the busbar 106, and vice-versa.

In exemplary embodiments, the outer insert 112 of the snap-on assembly 100A does not sit outside the threshold of the housing 102, while the insert 114 of the snap-on assembly 100B does sit outside the threshold of the housing. Because the busbar 106 has a width, $w_1$, that is slightly smaller than the width, $w_2$, of the opening 136, the insert 114 extends beyond the threshold of the housing 102. For a smaller busbar, this may not be the case. In exemplary embodiments, the insert 114 is also customizable to fit the dimensions of the busbar 106. Further, for a larger cable than the cable 104, the outer insert 112 may extend beyond the threshold of the housing 102. In exemplary embodiments, the outer insert 112 and the inner insert 110 are customizable to fit the circumferential dimension of the cable 104. In some embodiments, if the cable 104 is not circular, but is oval or some other shape, the outer insert 112 and the inner insert 110 are modified to fit with the shape of the cable. Further, for very large cables or busbars, that is, those that exceed the dimensions of the opening 136, the housing 102 of the snap-on assembly 100 is scaled to fit around the cables or busbars, in exemplary embodiments.

The inserts may be modified to support different sizes and shapes of the conductor, whether a cable or a busbar. The busbar may be rectangular in shape or be a rounded rectangular shape, for example. Or, the busbar may have an atypical shape, such as a busbar that is custom-made to support a particular application. Further, the cable may be isolated, such as with a sheath covering the copper cable. Or, the cable may be without isolation, such as for applications in which an increased current level is desired. As long as the cross-section of the cable or the busbar is able to be fit within the housing 102, the snap-on assembly 100 may feature modified inserts to facilitate the size and shape of the conductor.

Sensors 108a and 108b (collectively, "sensors 108") are disposed in the first side 130 and third side 134, respectively, of the housing 102. In some embodiments, the sensors 108 are Hall sensors, anisotropic magneto-resistive (AMR) sensors, or tunnel magnetoresistance (TMR) sensors. Magnetic field strength vectors B1 and B2 are shown for each sensor 108. In one embodiment, the sensor 108b is optional, as the snap-on assembly 100 may operate with a single sensor 108a (non-compensated output signal) or may operate with both sensors (compensated output signal).

In exemplary embodiments, each sensor 108 is an integrated circuits (IC) including a magnet to perform current sensing based on the magnetic field formed around the cable or busbar. In exemplary embodiments, two sensors are used so that stray magnetic fields can be detected and subtracted from the measured magnetic field of the current through the cable 104 or busbar 106. In exemplary embodiments, the sensors 108 send signals to an electronic circuit (not shown), for interpreting the measured current. In exemplary embodiments, the ICs can be placed on the top or bottom of the cable or busbar or placed on one side to share with the same printed circuit board assembly.

Figure 2A:
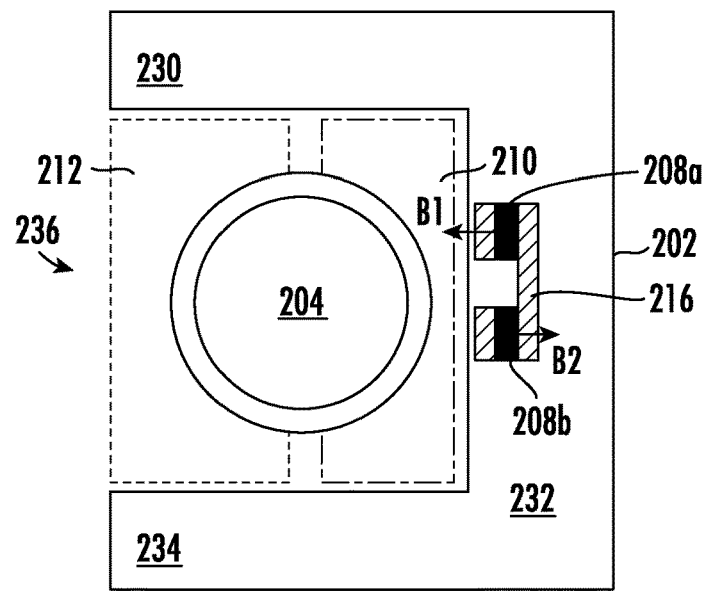
FIGS. 2A-B are diagrams illustrating a snap-on assembly, in accordance with exemplary embodiments.
Figure 2B:
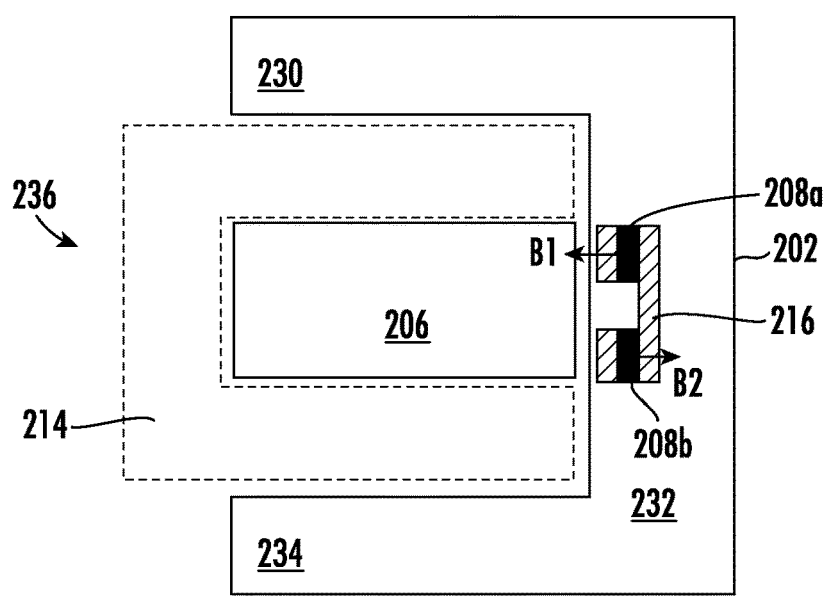

FIGS. 2A and 2B are representative drawings of a second snap-on assembly for sensing current across a conductor, such as a cable or busbar, according to exemplary embodiments. FIG. 2A is an overhead view of snap-on assembly 200A for affixation on a cable; FIG. 2B is an overhead view of snap-on assembly 200B for affixation on a busbar (collectively, "snap-on assembly 200"). The snap-on assembly 200 features a housing 202 with first side 230, second side 232, and third side 234, with first side 230 being connected at one end and perpendicular to second side 232, second side 232 being connected at one end and perpendicular to first side 230 and at the other end and perpendicular to third side 234, such that first side 230 and third side 234 are parallel to on another. First side 230 and third side 234 may also be referred to herein as opposing sides. From the overhead view, the first side 230, second side 232, and third side 234 look like a backwards letter "C" or a sideways letter "U".

The snap-on assembly 200A of FIG. 2A measures the current across a cable 204. An inner insert 210 is placed in an opening 236 of the housing 102, followed by the cable 204, and an outer insert 212 is then placed in the housing. In exemplary embodiments, the inner insert 210 and the outer insert 212 surround the cable 204, holding the cable in place inside the opening 236 of the housing 202. In exemplary embodiments, the inner insert 210 and the outer insert 212 are made of a non-conductive material, such as plastic. The disclosed embodiments are not limiting in this regard.

The housing 202 of snap-on assembly 200A is not different from the housing of snap-on assembly 200B. As with the examples of FIGS. 1A and 1B, the housing 202 is interchangeable, whether the application is to perform current sensing of the cable 204 or of the busbar 206. By simply removing the insert 214 and replacing it with the inner insert 210 and the outer insert 212, the application of the snap-on assembly 200 can change from the busbar 206 to the cable 204, and vice-versa.

The snap-on assembly 200B of FIG. 2B measures the current across a busbar 206. A single insert 214 is placed in the opening 236 to hold the busbar 206 in place. In exemplary embodiments, the insert 214 is shaped to surround the busbar 206, holding the busbar in place inside the opening 236 of the housing 202. In exemplary embodiments, the insert 214 is made of a non-conductive material, such as plastic. The disclosed embodiments are not limiting in this regard.

Sensors 208a and 208b (collectively, "sensors 208") are disposed adjacent to one another in the second side 232 of the housing 202, with a concentrator 216 disposed against each sensor. In some embodiments, the sensors 208 are Hall sensors, anisotropic magneto-resistive (AMR) sensors, or tunnel magnetoresistance (TMR) sensors. Magnetic field strength vectors B1 and B2 are shown for each sensor 208. In one embodiment, the sensor 208b is optional, as the snap-on assembly 200 may operate with a single sensor 208a. In exemplary embodiments, each sensor 208 is an integrated circuits (IC) including a magnet to perform current sensing based on the magnetic field formed around the cable or busbar. In exemplary embodiments, two sensors are used so that stray magnetic fields can be detected and subtracted from the measured magnetic field of the current through the cable 204 or busbar 206. In exemplary embodiments, the sensors 208 send signals to an electronic circuit (not shown), for interpreting the measured current.

Figure 3A:
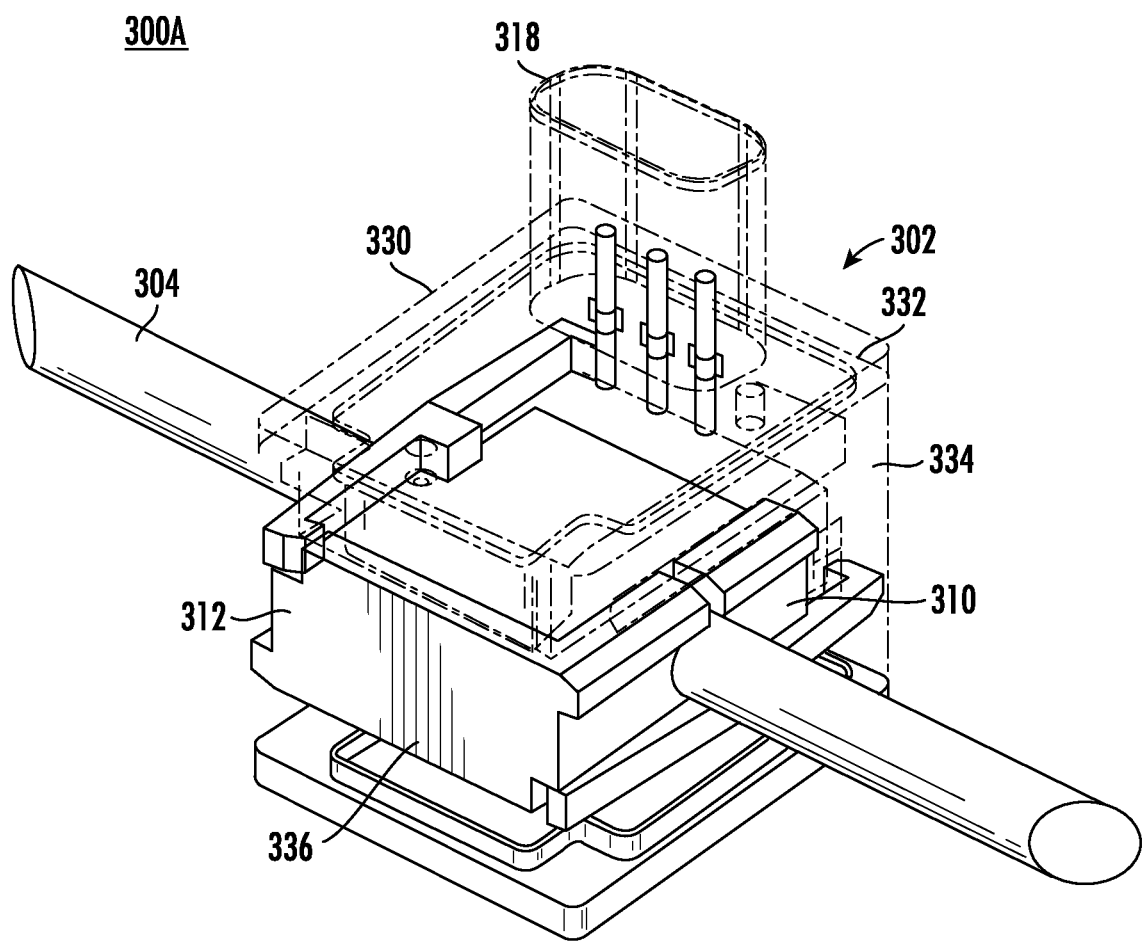
FIGS. 3A-3B are diagrams illustrating a snap-on assembly, in accordance with exemplary embodiments.
Figure 3B:
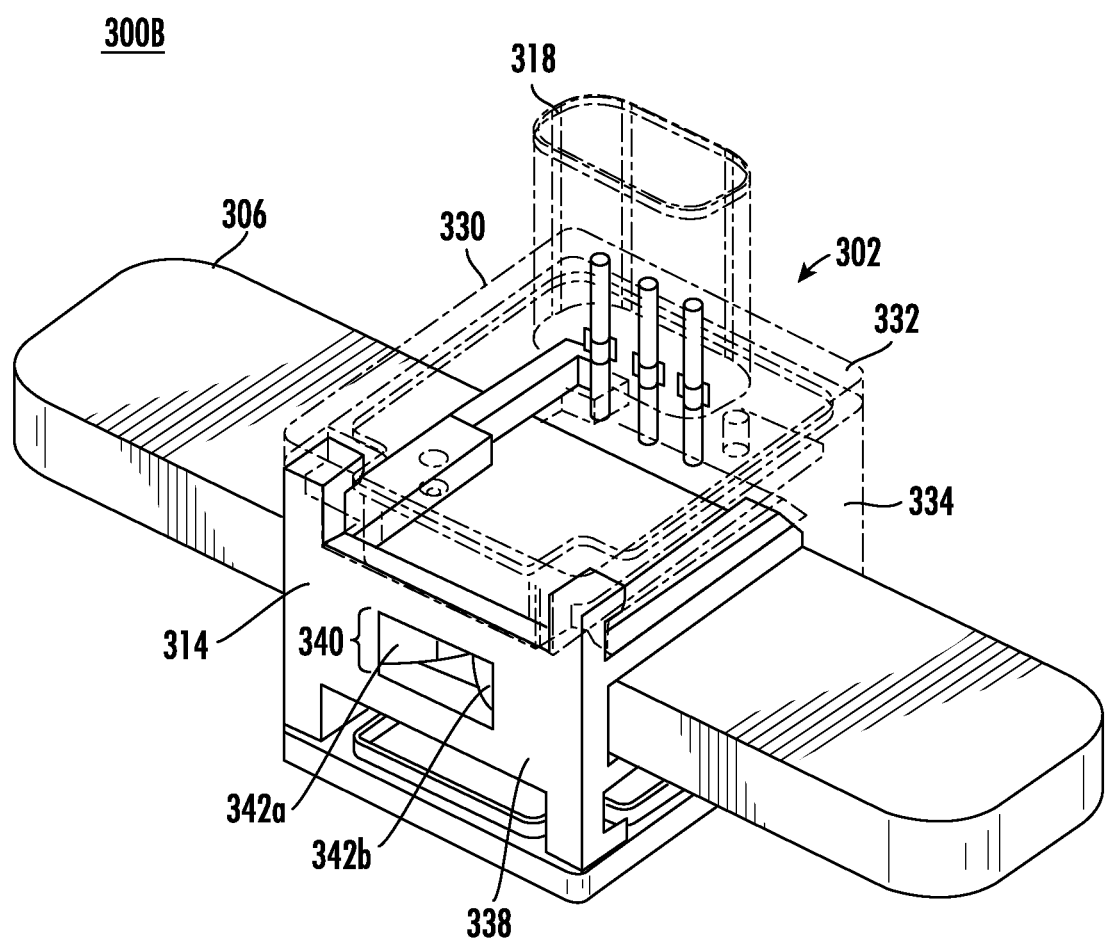

FIGS. 3A and 3B are representative drawings of a snap-on assembly for sensing current across a conductor, such as a cable or busbar, according to exemplary embodiments. FIG. 3A is a perspective view of snap-on assembly 300A for affixation on a cable; FIG. 3B is a perspective view of snap-on assembly 300B for affixation on a busbar (collectively, "snap-on assembly 300"). The snap-on assembly 300A may include the features of either the snap-on assembly 100A or 200A, and the snap-on assembly 300B may include the features of either the snap-on assembly 100B or 200B.

The snap-on assembly 300 features a housing 302 with first side 330, second side 332, and third side 334. The housing 302 may be configured with the ICs disposed as in FIGS. 1A-1B or as in FIGS. 2A-2B. In FIG. 3A, cable 304 is shown disposed between the inner insert 310 and the outer insert 312, with the inner insert connected to the outer insert within the housing 302. In exemplary embodiments, the inner insert 310 and the outer insert 312 surround the cable 304, holding the cable in place inside the housing 302. A back surface 336 of the outer insert 312 mates with the first side 330 and third side 334 of the housing, thus forming a rectangular cube structure.

In FIG. 3B, busbar 306 is shown surrounded by insert 314. In exemplary embodiments, the insert 314 is shaped to surround the busbar 306, holding the busbar in place inside the housing 302. In exemplary embodiments, the inner insert 310, outer insert 312, and insert 314 are made of a non-conductive material, such as plastic. The disclosed embodiments are not limiting in this regard. A back surface 338 of the insert 314 mates with the first side 330 and third side 334 of the housing, thus forming a rectangular cube structure.

In exemplary embodiments, the back surface 338 includes an opening 340 with depressions 342a and 342b (collectively, "depressions"). The depressions 342 are designed to press against the surface of the busbar 306, so as to prevent axial or longitudinal movement of the busbar. Axial movement or longitudinal movement of the busbar would be along its length, that is, to either side of the housing 302. The depressions 342 are described in more detail in conjunction with FIG. 4B, below.

A connector 318 is disposed at the top of the housing, for connecting the sensors inside the housing (not shown) to a power source. In one embodiment, in addition to supplying power to the snap-on assembly 300, the connector 318 further includes a dedicated pin for communicating the current signal sensed by the sensor ICs to an electrical circuit (not shown).

Figure 4A:
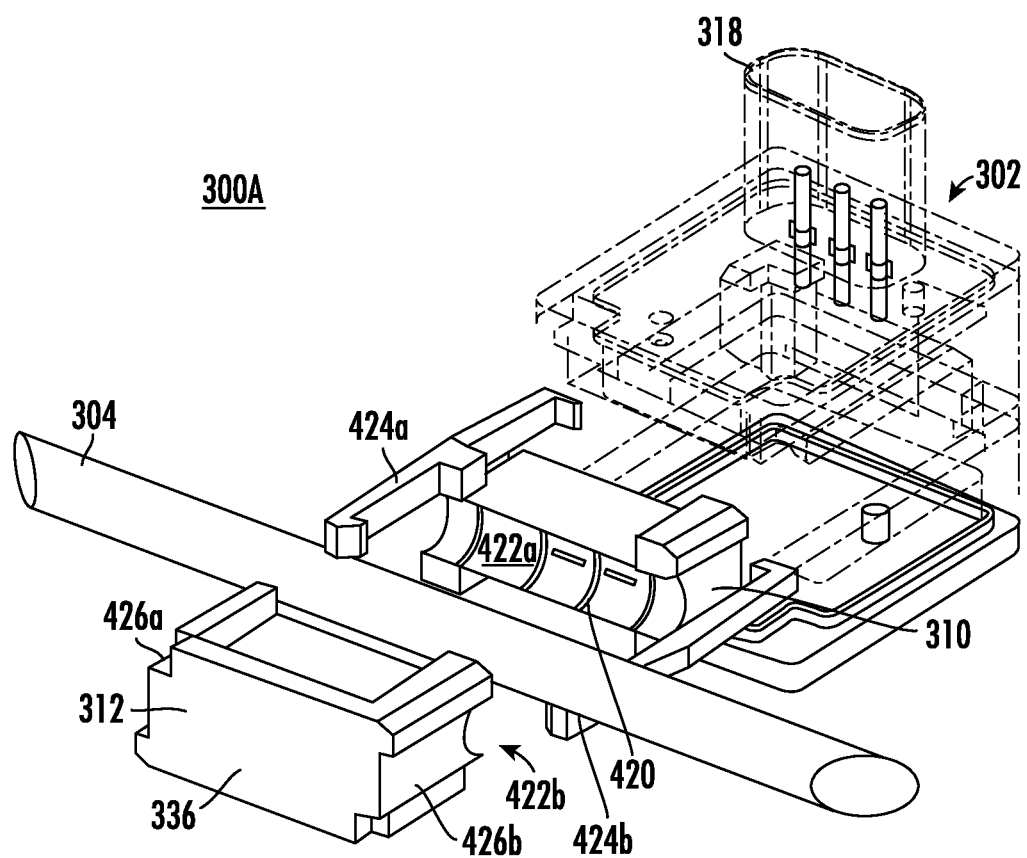
FIGS. 4A-4B are diagrams illustrating a snap-on assembly, in accordance with exemplary embodiments.
Figure 4B:
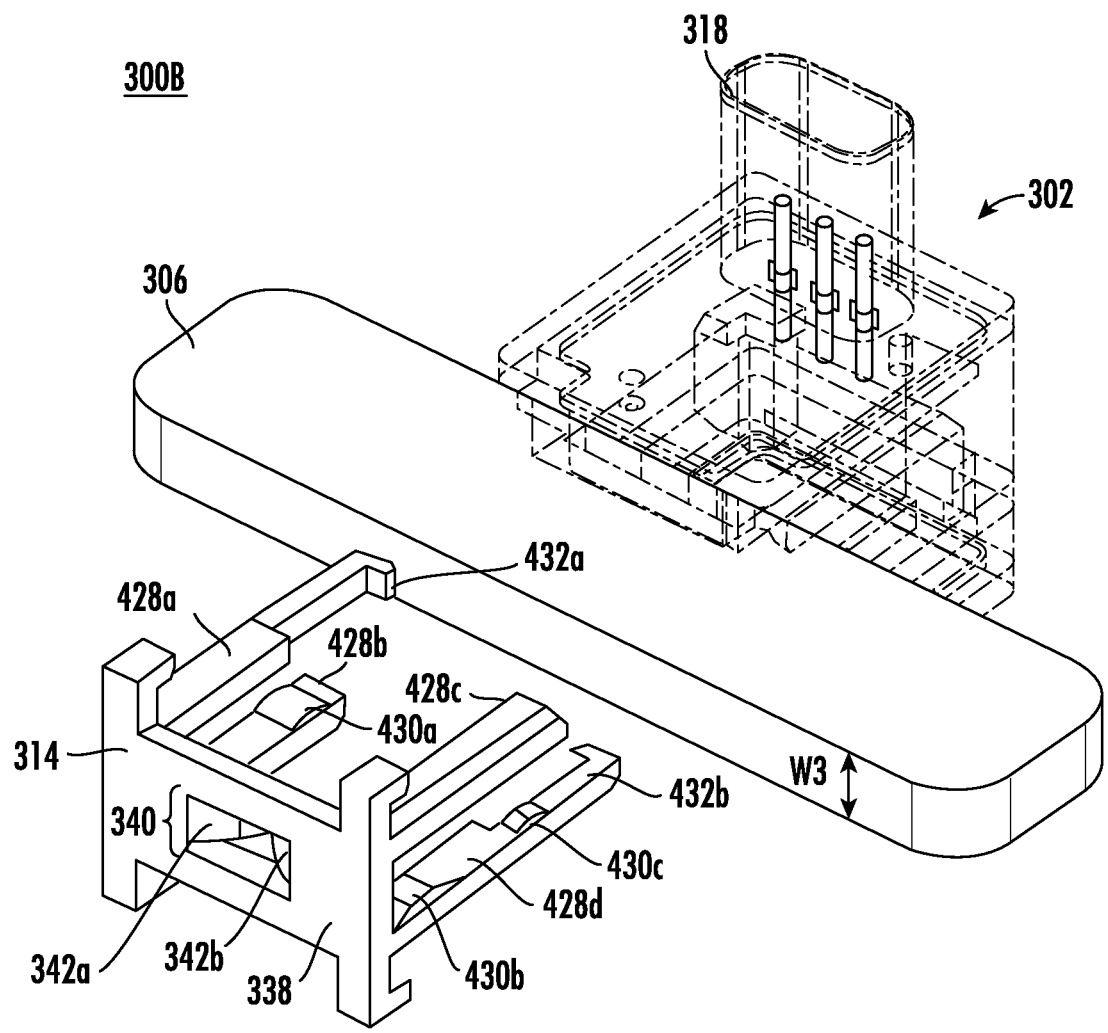

FIGS. 4A and 4B are representative drawings of the snap-on assembly 300 of FIGS. 3A and 3B, according to exemplary embodiments. FIG. 4A is an exploded perspective view of the snap-on assembly 300A for affixation on the cable 304; FIG. 4B is an exploded perspective view of the snap-on assembly 300B for affixation on the busbar 306. The housing 302 includes the connector 318, as before, for connecting the snap-on assembly 300 to a power source and for communicating the sensed current signal to an electrical circuit.

In FIG. 4A, the cable 304 is shown disposed between the inner insert 310 and the outer insert 312, with the inside portion of the inner insert being exposed. In exemplary embodiments, the inner insert 310 include a cylindrical receptacle 422a including ribs 420 for receiving the cable 304 on one side. Similarly, the outer insert 312 includes a cylindrical receptacle 422b including ribs (not shown) for receiving the cable 304 on the other side (collectively, "cylindrical receptacles 422"). The ribs 420 protrude somewhat from respective cylindrical receptacles 422 so that, when the cable 304 is pressed against the inner insert 310 and the outer insert 312 is pressed against the cable, the ribs 420 are pressed against the cable. In exemplary embodiments, the inner insert 310 and the outer insert 312 secure the cable 304 in the housing 302 of the snap-on assembly 300A. Further, in exemplary embodiments, the cylindrical receptacles 422 and the ribs 420 substantially prevent either rotational movement or axial movement of the cable 304 once the inner insert 310 and outer insert 312 are in place in the housing 302 of the snap-on assembly 300A.

In exemplary embodiments, the inner insert 310 further includes arms 424a and 424b (collectively, "arms 424") and the outer insert 312 includes receiving sleeves 426a and 426b (collectively, "receiving sleeves 426"), where arm 424a fits into receiving sleeve 426a and arm 424b fits into receiving sleeve 426b. Further, the arm 424a is disposed on one side of the cable 304 (e.g., over the cable in FIG. 4A) while the arm 424b is disposed on the other side of the cable (e.g., under the cable).

In FIG. 4B, the busbar 306 is shown inserted into the opening (e.g., opening 136 of snap-on assembly 100 or opening 236 of snap-on assembly 200, above) of the housing 302. The insert 314 includes a first leg 428a, a second leg 428b, a third leg 428c, and a fourth leg 428d (collectively, "legs 428"), which extend from the back surface 338 of the insert.

As shown in FIG. 3B, the back surface 338 of the insert 314 includes an opening 340 with depressions 342. The depressions 342 are designed to press against the surface of the busbar 306, so as to prevent axial movement (e.g., to either side of the housing 302) of the busbar. The opening 340 and optional depressions 342 are not featured on the back surface 336 of insert 312 (FIG. 3A or 4A). This is because the ribs 420 in the cylindrical receptacles 422 work to control rotation of the cable 304. Cable jackets tend to be elastic, which makes the ribs 420 stick to them quite well. Busbars, on the other hand, are rigid and so the depressions 342 are pushed against the busbar 306 when the insert 314 is pressed into the housing 302.

In exemplary embodiments, the snap-on assembly 300B has additional features to control movement of the busbar 306. For example, legs 428a and 428c are disposed on one side of the busbar 306 (e.g., above the busbar in FIG. 4B) while the legs 428b and 428d are disposed on the other side of the busbar (e.g., below the busbar). In exemplary embodiments, the legs 428a and 428b are disposed approximately a distance, $w_3$, which corresponds to the width of the busbar 306. Similarly, the legs 428c and 428d are disposed approximately a distance, $w_3$, apart. This distance ensures that the legs 428 fit snugly around the busbar 306. In exemplary embodiments, the legs 428 prevent up-and-down movement of the busbar 306. In exemplary embodiments, the insert 314 secures the busbar 306 in the housing 302 of the snap-on assembly 300B. Further, in exemplary embodiments, the legs 428 of the insert 314 substantially prevent axial movement of the busbar 306 once the insert is in place in the housing 302 of the snap-on assembly 300B.

In exemplary embodiments, the legs 428 further include features to ensure that the busbar 306 does not move. Dimples, three of which are shown as dimple 430a on leg 428b and dimples 430b and 430c on leg 428d (collectively, "dimples 430"), help to provide clamping force onto the busbar, to secure the busbar 306 in place axially, much as the ribs 420 do for the cable 304 (FIG. 3A). Orthogonal protrusions, two of which are shown, enhance the capacity of respective legs to grip the busbar 306 by giving support in another direction, that is, cross-wise, or along the shorter side of the busbar. As defined herein, cross-wise movement is perpendicular to axial movement, and up-and-down movement is perpendicular to both cross-wise and axial movement. The orthogonal protrusions 432 thus provide another of control over the movement of the busbar 306 than the depressions 342. Orthogonal protrusion 432a is disposed at the end of leg 428a (opposite the back surface 338) and orthogonal protrusion 432b is disposed at the end of leg 428d (collectively, "orthogonal protrusions 432"). In one embodiment, the orthogonal protrusions 432 are oriented 90° from the respective legs 428. In other embodiments, the orthogonal protrusions 432 are oriented out of plane from the respective legs 428 by some non-zero degree. The dimples 430 and orthogonal protrusions 432 help the legs 428 of the insert 314 to prevent axial movement of the busbar 306, in some embodiments. Further, the depressions 342 of the opening 340 are pushed against the busbar 306, in some embodiments, which also controls axial movement. Exemplary embodiments of the snap-on assembly 300B may include one or more of these features to control movement of the busbar in the housing 302 in axial, cross-wise, and up-and-down movement. Put another way, these features control movement in the X-, Y-, and Z-directions.

In exemplary embodiments, the snap-on assemblies 100, 200, and 300 can be secured to a conductor, such as a cable or busbar, without the use of a mechanical fasteners. As used herein, mechanical fasteners are defined as hardware objects made of steel, iron, or other metal material, and may include bolts and nuts, screws, rivets, anchor fasteners, and the like. Legacy current sensors depend on a mechanical fastener to secure the sensor to the conductor. This dependence on mechanical fasteners can become problematic. For example, if the current sensor is secured to the conductor using a bolt and nut, and the nut becomes loose, the current sensor may move from its intended position on the conductor. Further, a loose nut is more likely to be lost, such as in an automotive environment where the system itself, the vehicle, is designed to move. Once the nut is lost, it may not be long before the bolt is lost as well. Without its mechanical fastener, the reliability of the current sensor is thus compromised and may even be nonexistent.

Figure 5A:
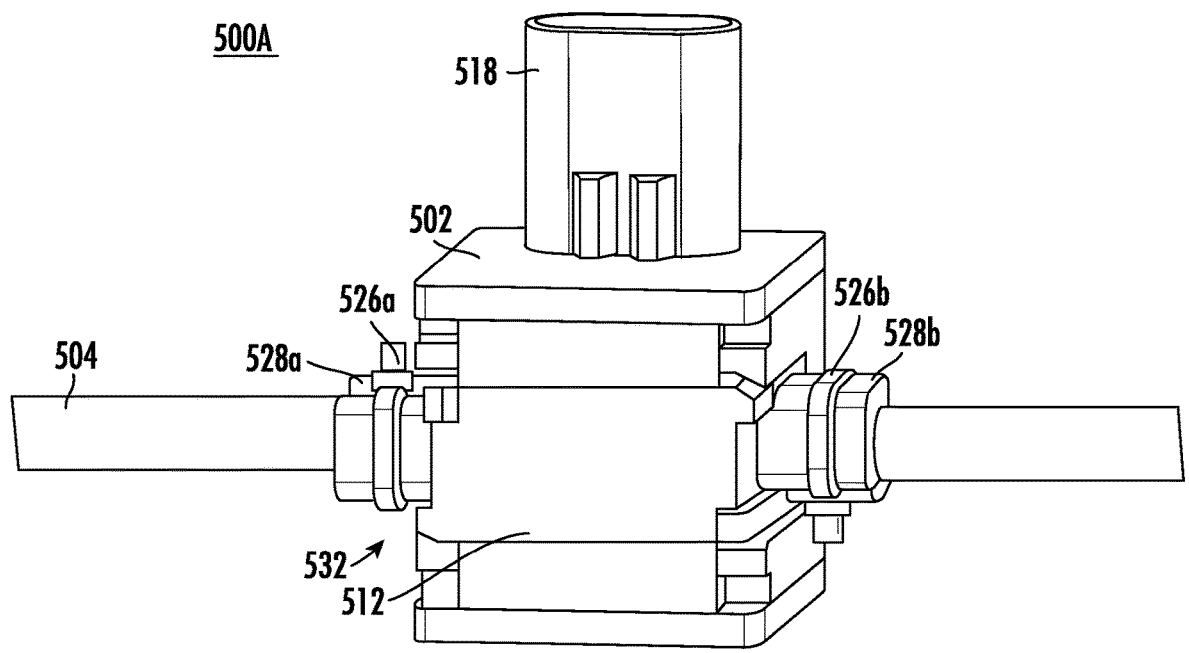
FIGS. 5A-5B are diagrams illustrating a snap-on assembly, in accordance with exemplary embodiments.
Figure 5B:
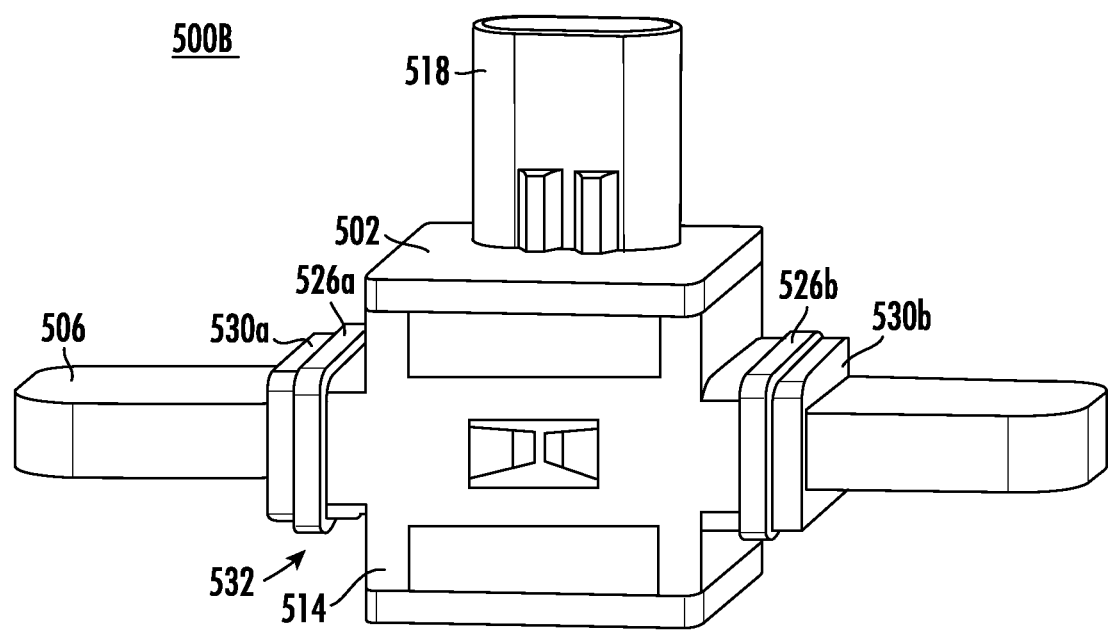

FIGS. 5A and 5B are representative drawings of a snap-on assembly for sensing current across a conductor, such as a cable or busbar, according to exemplary embodiments. FIG. 5A is a perspective view of snap-on assembly 500A for affixation on a cable; FIG. 5B is a perspective view of snap-on assembly 500B for affixation on a busbar (collectively, "snap-on assembly 500"). The snap-on assembly 500A may include the features, such as the IC arrangement, of either the snap-on assembly 100A or 200A, and the snap-on assembly 500B may include the features of either the snap-on assembly 100B or 200B. The snap-on assembly 500 features material, known generally as extensions, added to the insert(s) for gripping the cable or busbar, such that it is secure inside the housing.

Looking first at FIG. 5A, the snap-on assembly 500A is much like the snap-on assemblies 100, 200, and 300 shown and described above. The snap-on assembly 500A includes a C- or U-shaped housing 502 and a connector 518, and an outer insert 512 is visible. Further, in some embodiments, the housing 502 features a cylindrical extension 528a connected to one side of the housing, and a cylindrical extension 528b connected to the opposing side of the housing (collectively, "cylindrical extensions 528"). In exemplary embodiments, the cylindrical extensions are made of the same non-conductive material as the outer insert 512, such as plastic. In some embodiments, the cylindrical extensions 528 are formed separately from the outer insert 512 and inner insert (not shown) but are fit into the outer and inner inserts. In other embodiments, the cylindrical extensions 528 are formed along with the outer insert 512 and the inner insert. In this case, the cylindrical extensions 528 would be made as two separate semi-circular structures on each side of the inner and outer inserts, with one semi-circular structure on each side of the inner insert being part of, and an extension of, the inner insert and molded as a unitary structure, while the other semi-circular structure on each side being part of, and an extension of, the outer insert 512 and molded as a unitary structure.

In exemplary embodiments, the snap-on assembly 500A also includes wire ties 526a and 526b (collectively, "wire ties 526"), also known colloquially as "zip ties" or "flex cuffs". The wire ties 526 fit into grooves 532 of the cylindrical extensions 528 and are wrapped around the cylindrical extensions. The wire ties 526 is a strip of plastic material that is somewhat flat, with a rectangular cross-section. Each wire tie 526 features a rectangular opening at one end that is usually not much larger than the dimension of the rectangular cross-section. One-way teeth are disposed along the surface of the wire tie 526. At the end opposite the rectangular opening is a somewhat flat, smooth lip. The lip end of the wire tie 526 is threaded through the rectangular opening, with the wire tie being positioned around an object to be secured, which is, in this example, one of the cylindrical extensions 528. Once the wire tie 526 is pulled taut (tightened) against the cylindrical extension 528, the one-way teeth prevent the wire tie from being loosened. The wire tie 526 is thus designed to be easy to fasten but difficult to release.

In exemplary embodiments, the wire ties 526 are looped and tightened, as described above, to fixably secure the cylindrical extensions 528 to the cable 504. Because the cylindrical extensions 528 are connected to (or part of) the inserts 510 and 512, and the inserts are disposed within the opening of the housing 502, the cable will be secured within the housing of the snap-on assembly 500A. In contrast to mechanical fasteners such as nuts and bolts, the wire ties 526 are very reliable once secured around the cable 504, and do not loosen or break, even in extreme environments, such as when used in an operating vehicle. In exemplary embodiments, the wire ties 526, once secured to the cylindrical extensions 528, prevent both rotational and axial movement of the cable 504 inside the housing 502.

As illustrated in FIG. 5B, snap-on assembly 500B is much like the snap-on assemblies 100, 200, and 300 shown and described above. The snap-on assembly 500B includes a C- or U-shaped housing 502 and a connector 518, and an insert 514 is visible. Further, in some embodiments, the housing 502 features a rectangular extension 530a connected to one side of the housing, and a rectangular extension 530b connected to the opposing side of the housing (collectively, "rectangular extensions 530"). In exemplary embodiments, the rectangular extensions are made of the same non-conductive material as the insert 514, such as plastic. In some embodiments, the rectangular extensions 530 are formed separately from the insert 514 but are fit into the insert. In other embodiments, the rectangular extensions 530 are formed along with the insert 514. In this case, the rectangular extensions 530 would be disposed to the left and to the right of the insert 514 and molded as a unitary structure. And the busbar 506 would be threaded through one rectangular extension 530a, through the opening of the insert 514, and through the rectangular extension 530b, or vice-versa, before being inserted into the opening of the housing 502.

As with the cylindrical extensions 528 (FIG. 5A), the rectangular extensions 530 include grooves 532, for receiving wire ties 526, in exemplary embodiments. The wire ties 526 fit into grooves 532 of the rectangular extensions 530 and are looped and tightened, as described above, to fixably secure the busbar 506 to the housing 502 of the snap-on assembly 500B. In exemplary embodiments, the wire ties 526, once secured to the rectangular extensions 530, prevent axial movement of the busbar 506 inside the housing 502.

Thus, a novel snap-on assembly flexibly supports a conductor, such as a cable or busbar. The snap-on assembly is affixed to the conductor without need of mechanical fasteners, such as a screw and nuts, as in prior art current sensors. The snap-on assembly supports one sensor IC, for non-compensated signal outputs, or two sensor ICs, for compensated signal outputs. For the cable assembly, the inserts feature ribs, cylindrical receptacles, arms, and receiving sleeves to facilitate secure affixation, preventing rotational, axial, and up-and-down movement of the cable. For the busbar assembly, the insert features legs, dimples, and orthogonal protrusions to facilitate secure affixation, preventing axial movement of the busbar. The inserts may be modified to support different sizes and shapes of both cables and busbars. The inserts may optionally be coupled with extensions for use with wire ties, for additional security of the cable or busbar.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

While the present disclosure makes reference to certain embodiments, numerous modifications, alterations and changes to the described embodiments are possible without departing from the sphere and scope of the present disclosure, as defined in the appended claim(s). Accordingly, it is intended that the present disclosure not be limited to the described embodiments, but that it has the full scope defined by the language of the following claims, and equivalents thereof.

The invention claimed is:

1. A snap-on assembly comprising:
    a housing holding a first integrated circuit (IC), the first IC comprising a first sensor;
    a connector to supply power to the first IC and to transmit a signal from the first IC to an electronic circuit;
    a first insert to fit into an opening of the housing, the first insert including a first cylindrical receptacle for receiving a conductor on a first side thereof; and
    a second insert to fit into the opening of the housing, the second insert including a second cylindrical receptacle for receiving the conductor on a second side thereof opposite the first side,
    wherein the second insert is adapted to be placed in the opening of the housing, followed by the conductor, followed by the first insert,
    wherein the first insert and the second insert secure the conductor in the housing without a mechanical fastener, and
    wherein the first sensor measures a magnetic field resulting from a current traveling through the conductor.

2. The snap-on assembly of claim 1, wherein the conductor is a cable.

3. The snap-on assembly of claim 1, each of the first insert and the second insert further comprising:
    a plurality of ribs,
    wherein the plurality of ribs fit against the conductor once secured in the housing.

4. The snap-on assembly of claim 3, wherein the first insert and the second insert prevent rotational movement of the conductor.

5. The snap-on assembly of claim 3, wherein the first insert and the second insert prevent axial movement of the conductor.

6. The snap-on assembly of claim 1, wherein the first insert and the second insert are made of a non-conductive plastic.

7. The snap-on assembly of claim 1, further comprising:
    a second IC, the second IC comprising a second sensor,
    wherein the first IC and the second IC generate compensated signals.

8. The snap-on assembly of claim 7, the housing further comprising:
    a first side;
    a second side; and
    a third side,
    wherein the first side is coupled to the second side,
    wherein the first side is perpendicular to the second side,
    wherein the second side is coupled to the third side,
    wherein the second side is perpendicular to the third side, and
    wherein the first side is parallel to the third side.

9. The snap-on assembly of claim 8, wherein the first IC is disposed on the first side and the second IC is disposed on the third side.

10. The snap-on assembly of claim 8, wherein the first IC and the second IC are disposed on the second side.

11. A snap-on assembly comprising:
    a housing holding a first integrated circuit (IC), the first IC comprising a first sensor, wherein the first sensor measures a magnetic field resulting from a current traveling through a conductor;
    a first insert to fit into an opening of the housing, the first insert further comprising:
        a first cylindrical receptacle for receiving the conductor on a first side thereof;
        a first extension to be disposed on a first side of the housing, the first extension comprising a first groove; and
        a second extension to be disposed on a second side of the housing, the second side being opposite the first side, wherein the first side is parallel to the second side, the second extension comprising a second groove;
        a first wire tie to be looped around the first extension at the first groove and tightened; and
        a second wire tie to be looped around the second extension at the second groove and tightened; and
    a second insert to fit into the opening of the housing, the second insert further comprising:
        a second cylindrical receptacle for receiving the conductor on a second side thereof opposite the first side, wherein the second insert is adapted to be placed in the opening of the housing, followed by the conductor, followed by the first insert, wherein the first insert and the second insert secure the conductor in the housing without a mechanical fastener, and wherein the conductor is inserted through the first extension, the first insert, the second extension, the first wire tie, and the second wire tie to secure the conductor in the housing.

12. The snap-on assembly of claim 11, further comprising:

a second IC, the second IC comprising a second sensor, wherein the first IC and the second IC generate non-compensated signals.

13. The snap-on assembly of claim 12, wherein the conductor is a cable, the first extension is a first cylindrical extension, and the second extension is a second cylindrical extension.

* * * * *